(12) United States Patent
Huang et al.

(10) Patent No.: US 7,265,436 B2
(45) Date of Patent: Sep. 4, 2007

(54) NON-REPEATED AND NON-UNIFORM WIDTH SEAL RING STRUCTURE

(75) Inventors: Tai-Chun Huang, Hsinchu (TW);
Chih-Hsiang Yao, Taipei (TW);
Kuan-Shou Chi, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 171 days.

(21) Appl. No.: 10/780,512

(22) Filed: Feb. 17, 2004

(65) Prior Publication Data

US 2005/0179213 A1 Aug. 18, 2005

(51) Int. Cl.
*H01L 23/544* (2006.01)

(52) U.S. Cl. ............... 257/620; 257/E23.194; 257/758; 257/775; 257/483; 257/484; 438/458; 438/460; 438/462

(58) Field of Classification Search ........ 257/E23.179, 257/E23.145, E23.194, 775, 48, 207, 640, 257/669, 666, 734, 691, 692, 127; 438/458, 438/460, 462, 928; 174/261
See application file for complete search history.

(56) References Cited

U.S. PATENT DOCUMENTS

| | | | | |
|---|---|---|---|---|
| 4,914,503 A | * | 4/1990 | Shirato et al. ............... | 257/691 |
| 5,491,352 A | * | 2/1996 | Tsuji ............................ | 257/207 |
| 5,811,874 A | * | 9/1998 | Lee ............................... | 257/666 |
| 5,831,330 A | | 11/1998 | Chang et al. ................ | 257/620 |
| 5,834,829 A | | 11/1998 | Dinkel et al. ................ | 257/620 |
| 6,022,791 A | * | 2/2000 | Cook et al. ................... | 438/458 |
| 6,028,347 A | | 2/2000 | Sauber et al. ................ | 257/622 |
| 6,165,886 A | * | 12/2000 | Lin et al. ...................... | 438/612 |
| 6,291,835 B1 | * | 9/2001 | Tsuji et al. ..................... | 257/48 |
| 6,300,223 B1 | * | 10/2001 | Chang et al. ................ | 438/460 |
| 6,399,897 B1 | * | 6/2002 | Umematsu et al. .......... | 174/261 |
| 6,509,622 B1 | * | 1/2003 | Ma et al. ...................... | 257/483 |
| 6,570,243 B1 | * | 5/2003 | Hagihara ..................... | 257/620 |
| 6,806,168 B2 | * | 10/2004 | Towle et al. ................. | 438/460 |
| 2001/0030358 A1 | | 10/2001 | Okada et al. | |

FOREIGN PATENT DOCUMENTS

JP 06244405 A * 9/1994

OTHER PUBLICATIONS

Co-pending U.S. Appl. No. 09/989,837, filed on Nov. 20, 2001, assigned to the same assignee, "RF Seal Ring Structure".

* cited by examiner

*Primary Examiner*—Jerome Jackson
*Assistant Examiner*—Chris C. Chu
(74) *Attorney, Agent, or Firm*—Haynes and Boone, LLP

(57) ABSTRACT

A method of forming an improved seal ring structure is described. A continuous metal seal ring is formed along a perimeter of a die wherein the metal seal ring is parallel to the edges of the die and sloped at the corner of the die so as not to have a sharp corner and wherein the metal seal ring has a first width at the corners and a second width along the edges wherein the first width is wider than the second width.

18 Claims, 4 Drawing Sheets

NON-REPEATED AND NON-UNIFORM WIDTH SEAL RING STRUCTURE

FIELD OF THE INVENTION

The present invention relates generally to an improved method of forming a seal ring structure and more specifically to a method for forming a seal ring structure having good moisture protection and die corner peeling and crack prevention.

BACKGROUND OF THE INVENTION

An edge seal is commonly used as a mechanical barrier to contaminants introduced in the die sawing process, including moisture that may disrupt the performance of the integrated circuit device. A conventional edge seal consists of a combination of metal lines connected by line-type vias. Such an edge seal does not protect the chip corners from delaminating and cracking. During singulation, cracks sometimes develop, then propagate through the seal ring during reliability testing. Delaminations have been found to occur near corners where stress is highest.

FIG. 1 illustrates a top view of a conventional seal ring structure. Seal ring 11 encloses die 60. As shown in FIG. 2, seal ring 21 has a sloped corner area instead of a sharp corner to decrease stress. FIG. 3 shows a seal ring 31 having slots 33 within it. The slots may or may not help to decrease stress. FIG. 4 shows a repeated redundant crack stop seal ring 41. This seal ring has the disadvantage of taking up a lot of design space, not only at the corners, but along the whole length of the seal ring. It is desired to find a method of forming an edge seal that will not delaminate or crack.

Co-pending U.S. patent application Ser. No. 09/989,837 filed on Nov. 20, 2001 and assigned to the same assignees as the present invention describes a seal ring having alternating widths along its length. U.S. Pat. No. 6,300,223 to Chang et al and U.S. Pat. No. 5,831,330 to Chang teach the use of plugs in a seal ring to prevent cracking. U.S. Pat. No. 5,834,829 to Dinkel et al describes the redundant seal ring structure of FIG. 4. U.S. Pat. No. 6,028,347 to Sauber et al show trenches formed outside the seal ring at the corners. U.S. Patent Application 2001/0030358 to Okada et al teach a method of seam welding of the seal ring at the corners to prevent cracking.

SUMMARY OF THE INVENTION

Accordingly, it is an object of the present invention to provide an improved method for forming a seal ring structure in the fabrication of integrated circuits.

Another object of the present invention is to provide a method for forming a seal ring structure having a wider corner structure.

A further object of the invention is to provide a method for forming a seal ring structure having one width at the corners and a smaller width along the edges of the die.

According to the objects of the present invention, a method of forming an improved seal ring structure is achieved. A continuous metal seal ring is formed on a substrate along a perimeter of a die wherein the metal seal ring encloses device structures, wherein the metal seal ring is parallel to the edges of the die and sloped at the corner of the die so as not to have a sharp corner, and wherein the metal seal ring has a first width at the corners and a second width along the edges wherein the first width is wider than the second width.

Also according to the objects of the invention, an improved seal ring structure is achieved. The seal ring comprises a plurality of layers of metal lines formed overlying a substrate and a plurality of metal vias through intermetal dielectric layers between the layers of metal lines wherein the metal vias interconnect the metal lines and wherein the plurality of layers of interconnected metal lines forms a continuous seal ring around a die and wherein a first width of the metal lines at a corner of the die is wider than a second width of the metal lines at edges of the die.

Also according to the objects of the invention, an improved semiconductor device is achieved. The semiconductor device comprises semiconductor device structures formed in and on a substrate and a seal ring enclosing the semiconductor device structures forming a single die wherein a first distance between the semiconductor device structures and a corner portion of the seal ring is smaller than a second distance between the semiconductor device structures and an edge portion of the seal ring.

BRIEF DESCRIPTION OF THE DRAWINGS

The present invention will be more clearly understood from the following description taken in conjunction with the accompanying drawings in which like reference numerals designate similar or corresponding elements, regions and portions in which.

DETAILED DESCRIPTION OF THE PREFERRED EMBODIMENTS

Figure 1:
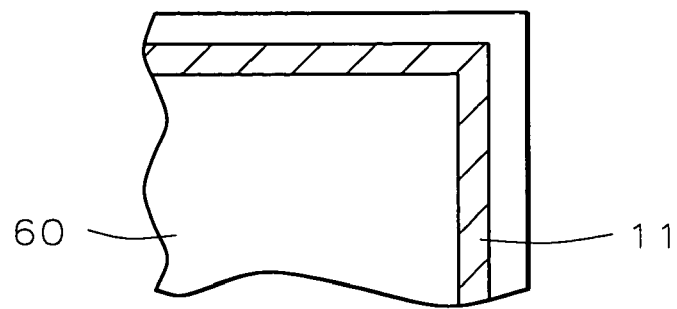
FIGS. 1 through 4 illustrates top views of portions of seal ring structures of the prior art.
Figure 2:
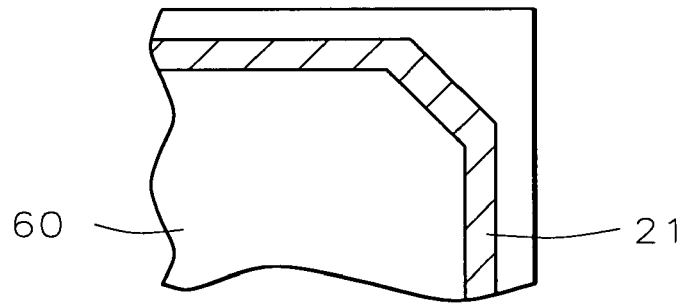
Figure 3:
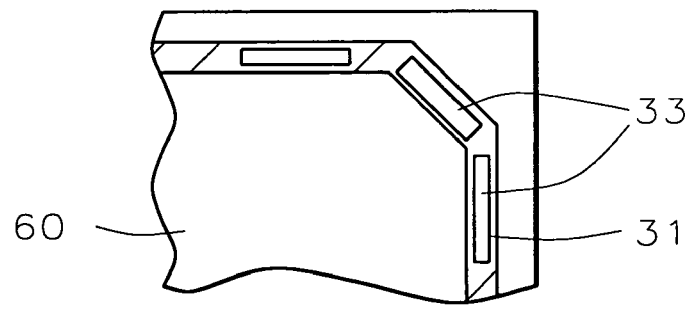
Figure 4:
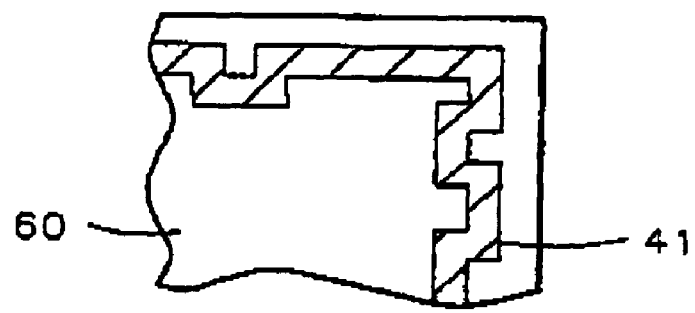
Figure 5:
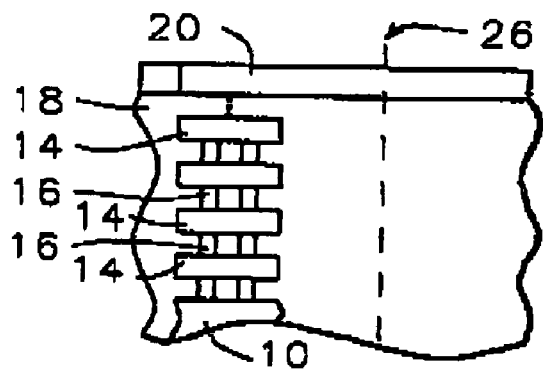
FIG. 5 is a cross-sectional view of a preferred embodiment of the present invention.

FIG. 5 shows a cross-section of a metal seal ring structure. A seal ring is a continuous metal structure outside of all of the active devices of the integrated circuit, except perhaps those devices used for temperature testing. Tungsten plugs or copper vias 16, for example, through an intermetal dielectric layer 18 connect metal lines 14 together, above substrate 10, to form a seal ring. Multiple layers of metal lines interconnected with vias are formed and capped with a passivation layer 20. The active devices are formed within the interior of the die. The die is cut at the scribe line 26. The seal ring structure is used on all dies to prevent moisture penetration into the interior of the die and to prevent crack propagation. It has been found that cracks and delaminations occur near corners where stress is high.

In a key feature of the present invention, the corners of the seal ring are strengthened by adding width without increasing the width of the rest of the seal ring. Increasing the width of the entire seal ring decreases the space available for integrated circuit structures on the die.

Figure 6:
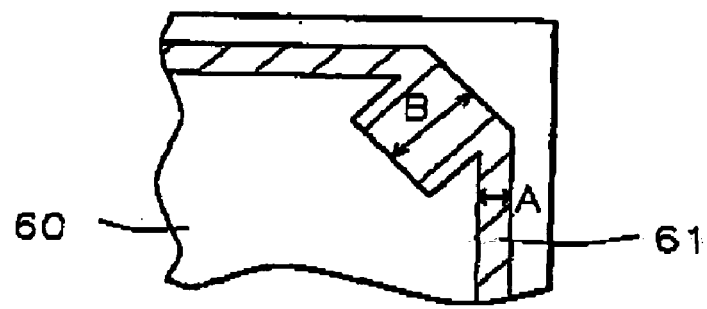
FIGS. 6, 7, and 8A through 8C are top views of several preferred embodiments of the present invention.

FIG. 6 shows one preferred embodiment of the present invention. Seal ring 61 has been formed to enclose the entire die 60. Active semiconductor device structures, not shown, are formed within the seal ring as is conventional in the art. The seal ring has a first width A on the edges of the die and a second width B at the corner of the die. The corner width B is thicker than the width A. Preferably, the corner portion of the seal ring width is about 1.5 times the width of the edge portion of the seal ring or greater.

Figure 7:
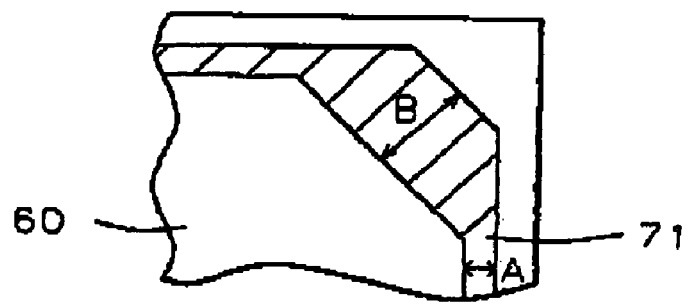

FIG. 7 shows a second preferred embodiment of the present invention. Seal ring 71 has a first width A on the edges of the die and a second width B at the corner of the die. The corner width B is thicker than the width A. In this embodiment, the wide corner area covers the entire corner section of the seal ring. In FIG. 6, the wide corner area covers only the central portion of the corner section.

Figure 8A:
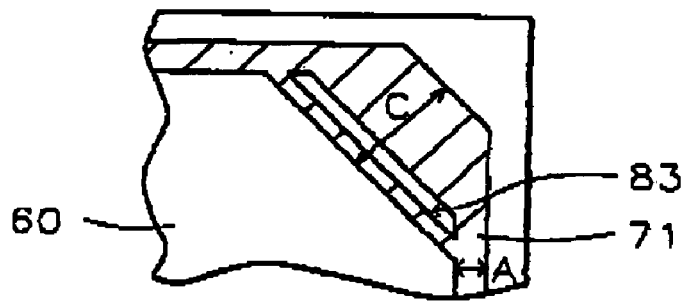
Figure 8B:
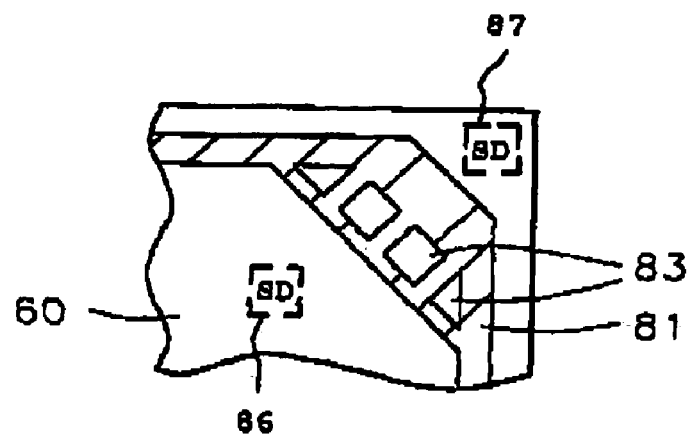
Figure 8C:
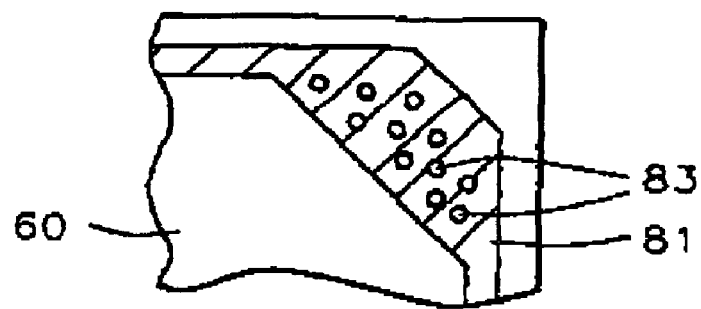

FIG. 8A shows a third preferred embodiment of the present invention. Seal ring 81 has a first width A on the edges of the die and a second width C at the corner of the die. The corner width C is thicker than the width A. In this embodiment, the wide corner area covers the entire corns section of the seal ring. Also in this embodiment, a slot 83 is formed within the wide corner area. The slot can further reduce stress caused by the large wide metal corner section. FIGS. 8B and 8C show other examples of slot and/or hole formations that can be used to reduce metal stress. It will be understood by those skilled in the art that a number of different slot and/or hole configurations could be used in the process of the present invention. In FIG. 8B, two semiconductor devices SD are shown diagrammatically at 86 and 87, where the semiconductor device 86 is located inside the seal ring 81, and the semiconductor device 87 is located outside the seal ring 81.

Figure 9:
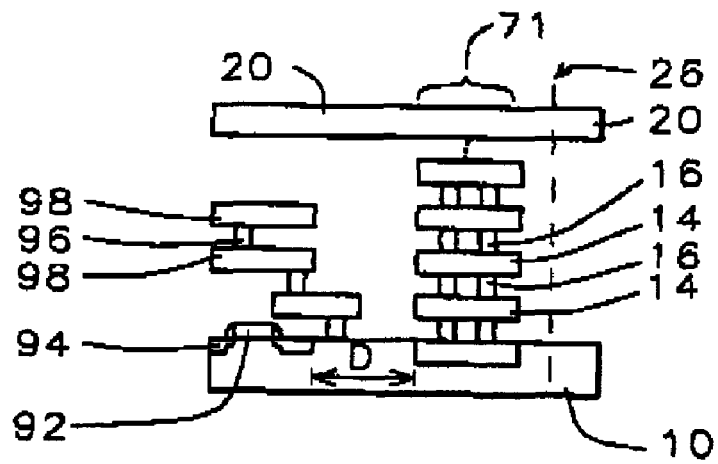
FIG. 9 is a top view of an entire seal ring of the present invention.
Figure 10:
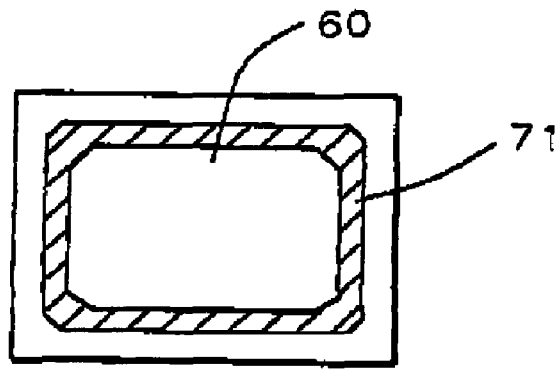
FIG. 10 is a cross-sectional view of a seimconductor device structure of the present invention.

FIG. 10 shows a top view of a single die of the invention. The seal ring 71 encircles the die 60. The embodiment of FIG. 7 is shown in this figure. It will be understood that all embodiments of the seal ring surround the die as shown in FIG. 10. FIG. 9 illustrates a cross-section of the seal ring 71, for example, as illustrated in FIG. 5. Device structures such as gate electrode 92, source and drain regions 94, metal vias 96, and metal lines 98 are shown. The semiconductor device structures shown in FIG. 9 are examples of the device structures that comprise the integrated circuit device 60 shown in FIG. 10. The distance D between the semiconductor devices and the seal ring may be shorter in the corner region of the die than it is on the edge portions of the die because the seal ring width is increased in the corner region. The advantage of increasing the seal ring width only in the corner region is to increase the die active circuit area.

The improved edge seal structure of the present invention provides stress relief at the chip corner and prevents chip corner delamination during cutting as well as providing good moisture protection to the device.

While the present invention has been particularly shown and described with reference to the preferred embodiment thereof, it will be understood by those skilled in the art that various changes in form and detail may be made without departing from the spirit and scope of the invention.

What is claimed is:

1. A seal ring structure comprising:
   a substrate;
   a plurality of layers of metal lines formed overlying said substrate; and
   a plurality of metal vias through intermetal dielectric layers between said layers of metal lines;
   wherein said metal vias interconnect said metal lines;
   wherein said plurality of layers of interconnected metal lines forms a continuous seal ring around a die, said seal ring having a plurality of edge portions and a plurality of corner portions, each said edge portion extending between a respective pair of said corner portions, each said corner portion of said seal ring having approximately straight first and second edges on inner and outer sides thereof that are approximately parallel to each other, and that are sloped at an angle to each of two said edge portions located adjacent that corner portion, so each said corner portion is free of a sharp corner; and
   wherein a first width of said metal lines between said first and second edges of each said corner portion is wider than a second width of said metal lines at each said edge portion.

2. The seal ring structure according to claim 1, wherein portions of said metal lines that serve as said edge portions are parallel to edges of said die.

3. The seal ring structure according to claim 1, wherein only a portion of each said corner portion has a width wider than said second width.

4. The seal ring structure according to claim 1, wherein the whole of each said corner portion has a width wider than said second width.

5. The seal ring structure according to claim 1, wherein one or more slots or holes are formed in said first width of said metal lines at each said corner.

6. The seal ring structure according to claim 1, wherein said first width is about 1.5 times said second width or greater.

7. The seal ring structure according to claim 1, further comprising semiconductor device structures within said die wherein a first distance between said semiconductor device structures and each said corner portion of said seal ring is smaller than a second distance between said semiconductor device structures and each said edge portion of said seal ring.

8. The seal ring structure according to claim 7, wherein all active semiconductor device structures in said die are located within said seal ring and wherein devices involved in temperature testing are located outside of said seal ring.

9. A semiconductor device comprising:
   semiconductor device structures formed in and on a substrate; and
   a seal ring enclosing said semiconductor device structures forming a single die, said seal ring having a plurality of edge portions and a plurality of corner portions, each said edge portion extending between a respective pair of said corner portions;
   wherein a first distance between said semiconductor device structures and each said corner portion of said seal ring is smaller than a second distance between said semiconductor device structures and each said edge portion of said seal ring; and
   wherein each said corner portion of said seal ring has approximately straight first and second edges on inner and outer sides thereof that are approximately parallel to each other, and that are sloped at an angle to each of two said edge portions located adjacent that corner portion, so each said corner portion is free of a sharp corner.

10. The device according to claim 9, wherein said semiconductor device structures include gate electrodes, source and drain regions, and a plurality of layers of interconnected conductive lines.

11. The device according to claim 9, wherein said semiconductor device structures include all active devices of said semiconductor device except for devices used for temperature testing.

12. The device according to claim 9, wherein said seal ring comprises:
   a plurality of layers of metal lines formed on said substrate; and a plurality of metal vias through intermetal dielectric layers between said layers of metal lines;

wherein said metal vias interconnect said metal lines; and wherein said plurality of layers of interconnected metal lines forms a continuous seal ring around said die.

13. The device according to claim 12, wherein portions of said interconnected metal lines that serve as said edge portions are parallel to edges of said die.

14. The device according to claim 9, wherein each said corner portion of said seal ring has a first width between said first and second edges thereof, wherein each said edge portion of said seal ring has a second width, and wherein said first width is wider than said second width.

15. The device according to claim 14, wherein said first width is about 1.5 times said second width or greater.

16. The device according to claim 14, wherein only a portion of each said corner portion of said seal ring has a width wider than said second width.

17. The device according to claim 14, wherein the whole of each said corner portion of said seal ring has a width wider than said second width.

18. The device according to claim 9, wherein one or more slots or holes are formed in each said corner portion of said seal ring.

* * * * *